Aug. 9, 1960 T. P. BOTHWELL 2,948,820

MULTIVIBRATOR CIRCUIT

Filed June 4, 1956 2 Sheets-Sheet 1

INVENTOR.
Theodore P. Bothwell
BY Morris [signature]
ATTORNEY.

Aug. 9, 1960 T. P. BOTHWELL 2,948,820

MULTIVIBRATOR CIRCUIT

Filed June 4, 1956 2 Sheets-Sheet 2

INVENTOR.
Theodore P. Bothwell
BY Morris L. Rabkin
ATTORNEY.

United States Patent Office 2,948,820

Patented Aug. 9, 1960

2,948,820

MULTIVIBRATOR CIRCUIT

Theodore P. Bothwell, Collingswood, N.J., assignor to Radio Corporation of America, a corporation of Delaware Filed June 4, 1956, Ser. No. 589,157

25 Claims. (Cl. 307—88.5)

This invention relates to semiconductor multivibrator circuits.

Multivibrator circuits are of three types, namely, astable, bistable, or monostable. An astable multivibrator is free-running, that is, self-oscillating. A monostable multivibrator has one stable state of operation and a second quasistable state. A trigger pulse applied to a monostable type multivibrator causes the circuit to shift to its quasi-stable state. After a certain period of time the monostable multivibrator circuit returns to its stable state.

A bistable multivibrator (often also referred to as a flip-flop) has two stable states of operation. Sometimes a bistable multivibrator is arrayed to be selectively set to either of its two stable states. Sometimes a bistable multivibrator is arranged to be triggered by a pulse to charge from either stable state to the other. Either when set or when triggered, it is usually desirable that the multivibrator be relatively independent of the supply voltages, operate at a high rate of speed, and have an output waveform with equal rise and fall times. Also in many applications, high output currents are required.

Multivibrators find many uses, for example, in the fields of communications, computers, television, radar, and many others. The circuit of this invention finds application in each of these fields and finds general application wherever multivibrators are desired. Bistable multivibrators, for example, find great use in computing circuitry as well as other applications wherein electrical type information storage is desired.

Each of these three types of multivibrators mentioned above may be constructed by using semiconductor devices. The usual forms of these semiconductor multivibrator circuits suffer from certain disadvantages. One of these disadvantages is that of high power dissipation within the circuit relative to that in the load. Another is that the supply voltage must be maintained at a somewhat critical level to obtain a stable frequency of oscillation and stable circuit operation. A frequent disadvantage of semiconductor multivibrator circuits is that the amount of available output current is severely limited.

Accordingly, it is an object of this invention to provide an improved semiconductor multivibrator circuit that operates with low power dissipation relative to that available for delivery to a load.

Another object of this invention is to provide an improved multivibrator circuit using semiconductor devices, which multivibrator circuit provides relatively high output currents.

A further object of this invention is to provide an improved transistor multivibrator which is comparatively more independent of the supply potential than prior transistor multivibrator circuits.

An additional object of this invention is to provide a novel transistor flip-flop which has equal rise and fall times, and has a low power dissipation.

Another object of this invention is to provide an improved transistor multivibrator which may function as a switch.

Still another object of this invention is to provide a novel transistor flip-flop which may function as a gated memory element with non-destructive read out.

In accordance with an embodiment of this invention, two pairs of transistors, the transistors of each pair being of the opposite conductivity type to that of the other pair, are coupled in a novel manner to form a multivibrator. The collector electrodes of one transistor of each pair are coupled together to a common point. The collector electrodes of the other transistor of each pair are coupled together to another common point. Each of these common points are coupled through a respective one of a pair of cross coupling networks to the base electrodes of the other transistor in each of said pairs. The emitter electrodes of each pair of the same conductivity transistors are coupled together and to a direct current source. A circuit embodying the invention may be any one of the three types of multivibrators, namely: astable, monostable, or bistable.

Another embodiment of this invention provides a four-transistor bistable flip-flop which may be employed as a gated memory element having non-destructive read out. Thus, by applying a signal to be gated in series with the direct current source and either of the coupled pairs of emitter electrodes, selective gating is obtained. The signal to be gated passes to either of the two flip-flop outputs depending upon the state of the flip-flop. After the application of the signal to be gated, the state of the flip-flop remains unchanged thereby achieving non-destructive read out of the flip-flop.

The novel features of this invention as well as the invention itself, both as to its organization and method of operation, will best be understood from the following description, when read in connection with the accompanying drawings, in which like reference numerals refer to like parts, in which.

Figure 1:
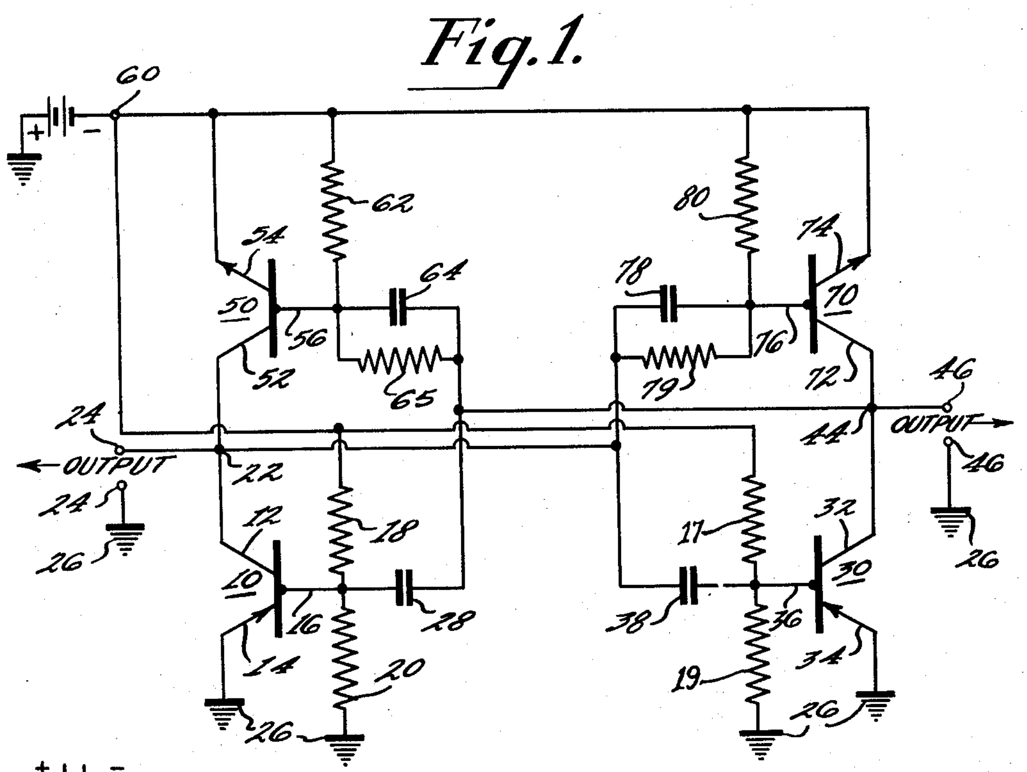
Figure 1 is a circuit diagram of an astable multivibrator embodying the present invention.

The astable multivibrator circuit illustrated in Figure 1 has no stable states and provides a free-running oscillator. The transistors which are illustrated in the drawing as being diagonally positioned have the same condition of conduction, and in operation successively change from a conducting to a non-conducting condition. Thus, the astable transistor multivibrator of Figure 1 includes a lower pair of left and right similar conductivity transistors 10 and 30 which may be of the P-N-P junction type of transistor. Each of the transistors 10 and 30 comprises a semi-conductive body having three electrodes. Thus, the lower left P-N-P transistor 10 includes a collector electrode 12, an emitter electrode 14, and a base electrode 16. The lower right P-N-P type transistor 30 includes a collector electrode 32, an emitter electrode 34, and a base electrode 36.

The remaining two transistors of the four-transistor flip-flop of Figure 1 comprise an upper pair of left and right transistors 50 and 70 having an opposite conductivity to that of the first pair of transistors 10 and 30. Each of the upper transistors 50 and 70, respectively, is an N-P-N type junction transistor. Each of the upper transistors 50 and 70 comprises a semi-conductive body having three electrodes. Thus, the upper transistor 50 includes a collector electrode 52, an emitter electrode 54, and a base electrode 56. Similarly, the upper right transistor 70 includes a collector electrode 72, an emitter electrode 74, and a base electrode 76.

The several electrodes of each of the four transistors 10, 30, 50 and 70, respectively, are intercoupled to provide multivibrator action. The collector electrode 52 of the upper left transistor 50 and the collector electrode 12 of the lower left transistor 10 are coupled to a left junction point 22. The left junction point 22 is coupled to one of a pair of output terminals 24. The other output terminal 24 is coupled to a point of reference potential 26 designated as ground. Outputs taken from the left output terminals 24 may be supplied to an impedance load, a purely resistive load, or a load having a finite bias. In this latter case any bias applied must be sufficiently less in magnitude so as not to overcome the effect of the direct current source for the flip-flop. Junction point 22 is also coupled through a pair of right upper and lower cross coupling networks 78—79 and 38, respectively, to the respective base electrodes 76 and 36 of the right upper and lower transistors 70 and 30. The upper right cross coupling network 78—79 is formed by a capacitor 78 and a resistor 79 connected in parallel. The lower right cross coupling network 38 includes a capacitor 38. The emitter electrodes 54 and 74 of the upper pair of transistors 50 and 70 are coupled to a negative terminal 60 of a source of direct current potential, such as a battery, as shown. The emitter electrodes 14 and 34 of the lower pair of transistors 10 and 30, respectively, are coupled to ground 26.

The base electrode 56 of the upper left N-P-N transistor 50 is coupled through a stabilizing resistor 62 to the negative terminal 60. The base electrode 16 of the lower left P-N-P transistor 10 is coupled at an intermediate point on a voltage divider formed by two stabilizing resistors 18 and 20, which are serially connected between the negative terminal 60 and the point of reference potential 26.

For normal amplifying action in a transistor, the bias voltage which is supplied between the emitter and base electrodes should be in the forward or relatively conducting direction and the biasing voltage which is applied between the collector and base electrodes should be in the reverse or non-conducting direction. Thus, for a P-N-P transistor, that is, one of N type conductivity, the collector should be biased negative with respect to the base, and the emitter should be biased positive with respect to the base. On the other hand, for an N-P-N transistor, that is, one of the P type conductivity, the collector should be biased positive with respect to the base, while the emitter should be biased negative with respect to the base. The biasing voltages for the lower pair of transistors 10 and 30 in the circuits embodying the invention are of these polarities.

The base electrode 76 of the upper right transistor 70 is coupled through a stabilizing resistor 80 to the negative terminal 60. Similarly, the base electrode 36 of the lower right transistor 30 is coupled at an intermediate point on a voltage divider formed by resistors 17 and 19 which are serially connected between the negative current source terminal 60 and ground 26. The emitter electrode 34 of the lower right transistor 30 is coupled to ground 26. The emitter electrode 54 of the upper left transistor 50 is coupled to the negative current source terminal 60.

The collector electrodes 32 and 72 of the lower and upper right transistors 30 and 70, respectively, are coupled to a right junction point 44. The right junction point 44 is coupled to one of a pair of output terminals 46, the other terminal of which is connected to the ground 26. The output load supplied may be of the same type as for the left output terminals 24. The output waveforms may be taken from either or both of the left or right pairs of output terminals 24 or 46. The right junction point 44 is coupled through a pair of left upper and lower coupling networks 64—65 and 28, respectively, to both the base electrodes 56 and 16 of the upper and lower left transistors 50 and 10, respectively. The upper left cross coupling network 64—65 is formed by a capacitor 64 and a resistor 65 connected in parallel. The lower left cross coupling network 28 includes a capacitor which is also designated by the numeral 28.

Note that the lower pair of similar conductivity transistors 10 and 30 have cross coupling capacitors 28 and 38, respectively. Similarly, the upper transistors 50 and 70, which are of an opposite conductivity to the lower pair of transistors 10 and 30, have cross coupling networks 64—65 and 78—79, respectively. Each of the cross coupling capacitors 28, 38, 64, and 78 are of substantially equal value. Similarly, each of the upper stabilizing resistors 62 and 80, respectively, are of substantially equal value, but less in value than either of the lower pairs of stabilizing resistors 18 and 20, and 17 and 19, respectively. The upper cross coupling resistors 65 and 79 are also of substantially equal value. Each of the resistors 18, 20, and 17, 19 in each of the respective lower pairs of resistors are substantially equal in value. However, the value of the parallel combination of the stabilizing resistors 18, 20 and 17, 19 is desirably less than that of the upper resistors 62 and 80. These upper and lower pairs of transistors are coupled by having their corresponding collector electrodes coupled to the same points, thereby forming a single multivibrator, in accordance with applicant's invention. The several transistors and associated circuit elements have been given upper, lower, left and right designations depending upon their relative locations as shown in the drawing. These locations need not correspond to the actual physical locations of these elements in an actual circuit when practicing applicant's invention.

In operation, the lower pair of transistors 10 and 30 have their emitter-base electrodes forward biased and tend to be relatively conducting, whereas the upper pair of transistors 50 and 70 have their emitter-base electrodes essentially "zero" or slightly reverse biased so as to be relatively non-conducting. Assume that the lower left transistor 10 is conducting current more heavily than the lower right transistor 30. Relatively greater current conduction in the lower left transistor 10 tends to make more positive the potential of the junction point 22. The positive increment in potential at the left junction point 22 is transmitted through the right cross coupling capacitors 78 and 38, respectively, to the corresponding base electrodes 76 and 36 of the upper and lower right transistors 70 and 30. With the application of the positive increment at its base electrode 36, the emitter-base diode 34—36 of the lower right transistor 30 becomes less forward biased than results from the action of the divider 17—19 alone. This results in a decrease in collector current of the lower right transistor 30.

Conversely, the emitter-base diode 74—76 of the upper right transistor 70 becomes forward biased and this transistor tends toward conduction. Increased conduction in the upper right transistor 70 and decreased conduction in the lower right transistor 30 causes the right junction point 44 to decrease in potential (i.e. in a negative direction) toward the value of the negative current source terminal 60. This decrease in potential at the right junction point 44 is transmitted through the left coupling capacitors 28 and 64, respectively, to the base electrodes 16 and 56, respectively, of the left transistors 10, 50. Application of this negative increment to the base electrode 56 of the upper left transistor 50 has little effect on conduction through this transistor, since its base electrode 56 was previously at approximately the potential of the direct current source 60, and the transistor 50 is already conductive at saturation. The application of the negative pulse to the base electrode 16 of the lower left transistor 10 increases the forward bias across the emitter-base diode 14—16 thereby tending to increase further the current flow through this transistor. The action is cumulative and the upper left transistor 50 and the lower right transistor 30 are driven to cutoff, whereas, the lower left transistor 10 and the upper right transistor 70 are driven to a state of relatively high conduction or saturation.

The characteristics of a transistor, when employed in switching applications, as in the present invention, are described in an article entitled, "Large Signal Behavior of Junction Transistors" by J. J. Ebers and J. L. Moll, appearing in volume 42, page 1761 of the "Proceedings of the I.R.E." In this article, it is stated that junction transistors (as well as point contact transistors) when used as a switch have essentially three regions of operation.

Region 1 is defined as collector current cutoff wherein the emitter-base junction (diode) of the transistor as well as the collector-base junction are reverse biased. The semiconductor diode, formed by these junction points, has a low impedance when biased in the forward direction and, conversely, a high impedance when biased in the reverse direction.

Region 2 is defined in the Ebers and Moll article as that condition existing when the emitter-base junction is forward biased but the collector-base junction is reverse biased.

Region 3 is then defined as that condition of conduction existing when the emitter-base, as well as the collector-base junction, is forward biased. The operation of the transistor in region 3 is that condition wherein the transistor is said to be in a state of relatively high conduction, or saturation. In this state of saturation the impedance between the emitter and collector electrodes is extremely low and the currents that flow through the transistor between the collector and emitter electrodes are determined solely by the characteristic of the external circuit. The term "saturation" as employed in this description has the above meaning. Similarly, the term "cutoff" refers to that condition which exists in region 1 as described in the Ebers and Moll article. The transitional region between cutoff and saturation of the transistors is that condition as described as region 2 of the Ebers and Moll article.

During the cumulative action described above which takes place during the change of state of the multivibrator, it was stated that a positive increment appeared at the left junction point 22, and conversely, a negative increment appeared at the right junction point 44.

The positive increment at the left junction point 22 is transmitted through the lower right cross coupling capacitor 38 to the base electrode 36 of the lower right transistor 30, thereby charging the cross coupling capacitor 38. A similar action takes place as a result of the negative increment from the right junction point 44 on the base electrode 16 of the lower left transistor 10. However, since the lower left transistor 10 is normally biased to conduct by the biasing resistor 18 and stabilizing resistor 20, the negative increment at this lower left transistor base electrode 16 can only tend to increase conduction in the lower left transistor 10. Accordingly, the transistor 10 does not control the period of time during which the multivibrator circuit of Figure 1 remains in this particular state. This time period is determined by the action of the right biasing resistor 17 and the right stabilizing resistor 19 upon the lower right coupling capacitor 38. Thus, immediately after the capacitor 38 becomes charged by the positive increment from the left junction point 22, the lower right cross coupling capacitor 38 begins to discharge through the resistors 17 and 19. Actually, the time constant of this discharge is determined by the variations of the resistor-capacitor combination 38, 19, 17 as mentioned above.

As soon as the lower right transistor emitter-base diode 34—36 becomes forward biased, as a result of the discharge of the lower right cross coupling capacitor 38, current flow in the lower right transistor 30 begins. The voltage at the right junction point 44 does not change immediately, because the upper right transistor 70, having been in a state of saturation, has available an excess of charge carriers which must be dissipated. This is often referred to as "storage" in a transistor. However, once these carriers are dissipated by current flow through the lower right transistor 30 to the collector electrode 72 of the upper right transistor 70, the potential at point 44 begins to change, and initiates a cycle such as that just described to again reverse the state of conduction of the multivibrator.

Thus, when conduction in the lower right transistor 30 is established, the excess of minority charge carriers in the upper right transistor 70 is immediately dissipated. The upper right transistor 70 thereupon leaves the state of saturation and during its change to a state of non-conduction and high impedance temporarily offers a finite impedance to the emitter-collector current flow in the lower right transistor 30. The potential at junction point 44 increases in a positive direction due to this conduction in the lower right transistor 30 and is passed as a positive increment through the left cross coupling networks 64—65 and 28 to the base electrodes 56 and 16 of the left hand transistors 50 and 10, respectively. The emitter-base diode 54—56 of the upper left transistor 50 becomes forward biased and the transistor starts conduction. Conversely, the lower left transistor 10 tends toward a state of relative non-conduction since the positive increment reverse biases its emitter-base diode 14—16.

Conduction in the upper left transistor 50 produces a decrease in potential at junction point 22 (which may be derived from the left output terminals 24) which is transmitted as a negative voltage increment through the right hand cross coupling networks 78—79 and 38. The base electrode 76 of the upper right transistor 70 becomes reverse biased and tends toward a state of relative non-conduction. Conversely, the negative increment which passes through the lower right cross coupling capacitor 38 to the base electrode 36 of the lower right transistor 30 tends to drive this transistor toward saturation. The cumulative action by which the state of a multivibrator is reversed again takes place and the state of the multivibrator changes. This state of conduction remains for a period of time, dependent upon the time constant of the base circuit of the lower left transistor 10 formed by the resistor-capacitor combination 18, 20, 28. When the capacitor 28 becomes discharged the lower left transistor 10 becomes conductive and the state of the flip-flop again reverses. Note that the "off" time constants are made determining here, since the "on" time constants are set by input characteristics of the transistors.

The switching times from one state of conduction to the other are equal, that is to say, the resulting output pulses which may be derived from either the output terminals 24 or 46 have substantially equal rise and fall times. One path of current flow in the flip-flop is from the current source, through the emitter and the collector electrodes of the conducting transistor, through the cross coupling network, and through the base-emitter diode of the other conducting transistor. Since the amount of current flowing into or out of the base electrode of a transistor is limited, the amount of dissipation existing in the circuit is small. Relatively large output currents are available at the output terminals 24 and 46, respectively, since the output loads are supplied directly from the current source 60 through a conducting transistor (preferably in saturation). The speed of operation is very high since the loop gain (for example, from the collector electrode 52 to junction point 22, through capacitor 38, capacitor 64, and base electrode 56) may be much greater than unity. The gain of this loop, with no load at either of the output terminals 24 or 46, may be shown to be $B^2$, where B is defined as the ratio of the collector current to the base current. A typical value for B may be 40, for example. A fixed collector swing is also available since the output terminals 24 and 46 are effectively clamped either to the potential of the direct current source at terminal 60 or to that of the reference potential 26.

In an alternative embodiment of Figure 1, the upper cross coupling resistors 65 and 79 may be omitted. The operation of this alternative embodiment is essentially the same as that described above. In this alternative embodiment the time constants of the respective upper transistor base electrode circuits 62—64 and 80—78 is greater than the time constants of the respective lower base electrode circuits 28, 20, 18 and 38, 17, 19. By this technique the lower cross coupling capacitors 28 and 38 discharge faster than the upper cross coupling capacitors 64 and 78. The upper pair of transistors 50 and 70 operate essentially as "slaves" to the lower pair of transistors, since the time constants associated with the lower pair have a greater control over the free-running frequency than those associated with the upper pair.

The circuit specifications may vary according to the design for any particular application. The following circuit specifications are included by way of example: The source applied to the terminal 60 is —6 volts; the value of each of resistors 62 and 80 is 5600 ohms; the value of each of the resistors 17 and 18 is 8200 ohms; the value of each of resistors 19 and 20 is 3300 ohms, the resistors 65 and 79 each has a value of 15,000 ohms, capacitors 28, 38 each has a capacity of .0015 microfarad and capacitors 64 and 78 each has a capacity of .001 microfarad. By reversing the polarity of the supply source 60 and of the type conductivity of each of the transistors, another circuit results which exhibits similar operating characteristics to those of the circuit just described.

Figure 2:
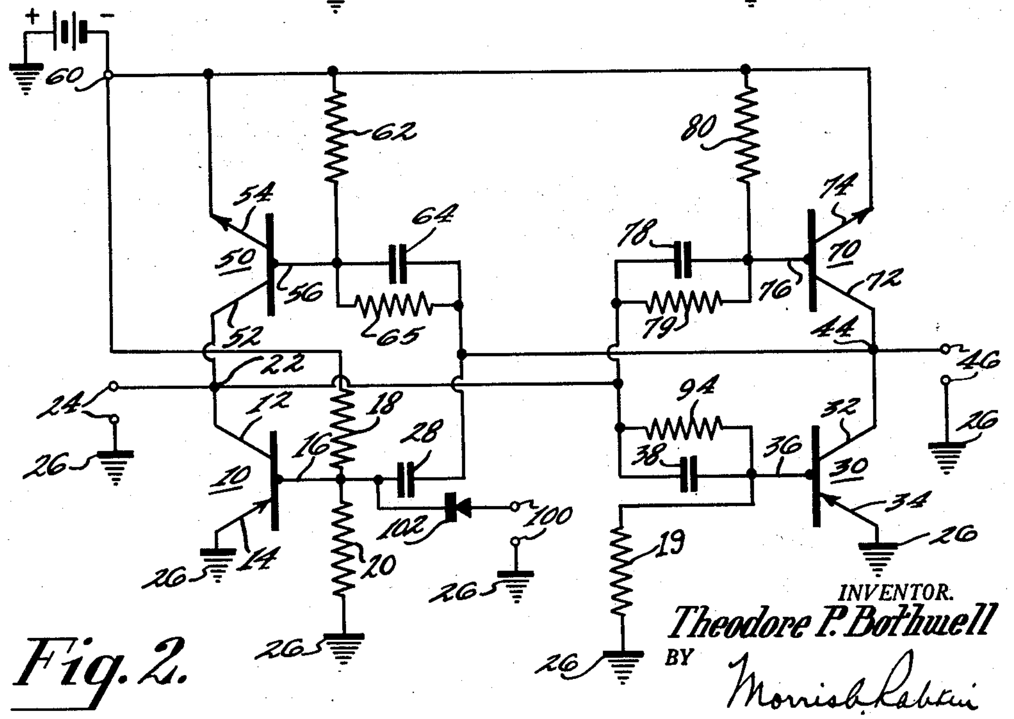
Figure 2 is a circuit diagram of a monostable multivibrator embodying this invention.

The monostable circuit of Figure 2 is in many respects similar to the circuit of Figure 1, and accordingly the corresponding elements of Figures 1 and 2 have been given the same reference numerals. In Figure 2 the right biasing resistor 18 for the lower right transistor 30 is omitted. In the lower right cross coupling network associated with the lower right transistor 30, the capacitor 38 is paralleled by a resistor 94. A trigger input from a pair of trigger input terminals 100 is provided. One of the input terminals 100 is coupled to the ground 26. The other input terminal 100 is coupled to the anode of a diode 102, the cathode of which is coupled to the base electrode 16 of the lower left transistor 10. Here, as in Figure 1, the upper transistors 50 and 70 may be "slaved," that is, made dependent on the potential at the left and right junction points 22 and 44 by the use of the cross coupling resistors 65 and 79.

In the operation of the circuit of Figure 2 the condition when the upper right transistor 70 and the lower left transistor 10 are conducting is the stable state of this circuit. This stable state is determined by the biasing resistor 18 which maintains the emitter-base diode 14—16 of the lower left transistor 10 quiescently conducting. In this state, current flow is established between the collector electrode 12 of the lower left transistor 10 and the base electrode 76 of the upper right transistor 70. Assume the monostable multivibrator of Figure 2 is in this stable condition.

A positive pulse at the ungrounded terminal 100 is applied through the diode 102 to the base electrode 16 of the lower left transistor 10. This positive pulse creates a reverse bias on the emitter-base diode 14—16 of the lower left transistor 10 thereby placing this transistor in a state of relative nonconduction. As the lower left transistor 10 is driven to a state of non-conduction, the lower left cross coupling capacitor 28 is charged through the diode 102. Simultaneously, the lower left transistor 10 acquires a finite impedance such that a negative voltage increment results at the left junction point 22. (This drop may also be ascribed to the decreased current flow through the upper right cross coupling network 78—79). The negative increment is transmitted to the right transistor base electrodes 76 and 36. In a manner similar to that described above in Figure 1, the upper right transistor 70 tends to a state of nonconduction and the lower right transistor 30 tends to a state of conduction. Storage, as described in the Ebers and Moll article, in the upper right transducer 70 is overcome by conduction in the lower right transistor 30. The right junction point 44 rises in potential to that of ground 26 producing an incremental positive voltage which is transmitted to the base electrodes 16 and 56 of the left transistors 10 and 50. The action is cumulative and the state of the multivibrator is reversed. The upper left transistor 50 and the lower right transistor 30 are in a state of high conduction of saturation.

The lower left cross coupling capacitor 28 begins to discharge through the biasing resistor 18 and stabilizing resistor 20 to the negative source at terminal 60. When the capacitor 28 becomes discharged the emitter-base diode 14—16 of the lower left transistor 10 becomes forward biased thereby placing this transistor 30 in a state of relative conduction. Conduction in the lower left transistor 10, after the saturation in the upper left transistor 50 is overcome, causes an increase in potential at junction point 22, which is transmitted as a positive increment through the upper right cross coupling capacitor 78 to the base electrode 76 of the upper right transistor 70. The emitter-base diode 74—76 of this transistor becomes forward biased causing conduction therein. The same positive-going waveform or increment is transmitted through the lower right cross coupling network 38—94 to the base electrode 36 of the lower right transistor 30 thereby tending to drive this transistor 30 toward cutoff. This action is cumulative and the state of conduction in the multivibrator is again reversed. The monostable multivibrator has returned to its stable state with lower left transistor 10 and upper right transistor 70 again conducting.

The time during which the monostable multivibrator remains in the quasi-stable state depends on the time constant of the RC network of the lower left cross coupling capacitor 28, stabilizing resistor 20, biasing resistor 18, and the reverse impedance of the emitter-base diode 14—16 of the lower left transistor 10. Most of the advantages of the astable circuit of Figure 1 are available in the monostable circuit of Figure 2.

Figure 3:
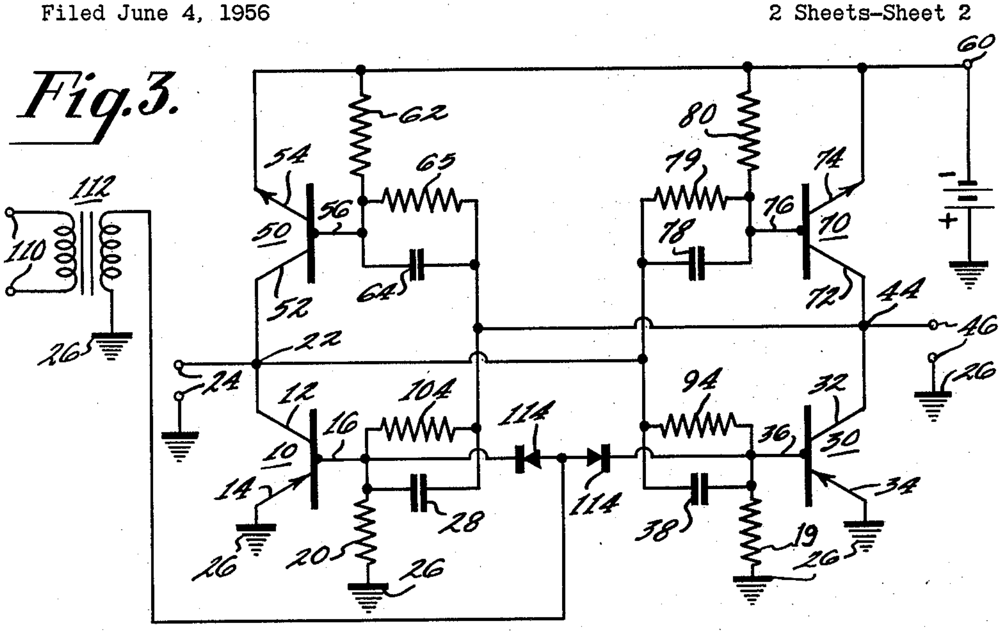
Figure 3 is a circuit diagram of a bistable multivibrator embodying this invention; and, Figure 4 is a circuit diagram of another bistable multivibrator embodying the invention and employed as a self-storing gate.

The circuit of Figure 3 is similar to that of Figure 2 in most respects. However, the circuit of Figure 3 is symmetrical. In Figure 3, all of the cross coupling networks consist of parallel connected resistors and capacitors. More specifically the lower left capacitor 28 is connected in parallel with a resistor 104 having a value substantially the same as the lower right resistor 94. The biasing resistor 18 is omitted.

A flip-flop is a bistable multivibrator wherein one stable state of the flip-flop is said to be set, and wherein the other is said to be reset. Two outputs are associated with the flip-flop circuit which are given the Boolean tags of "one" and "zero." If the flip-flop is in its set condition (that is, set) the "one" output voltage is high and the "zero" output voltage is low. If the flip-flop is in its reset condition (that is, reset) the "zero" output voltage is high and the "one" output voltage is low. The flip-flop may have a trigger terminal. Application of the pulses to the trigger terminal causes the flip-flop to assume the other condition from the one it was in when the pulse was applied. In Figure 3, a pair of input terminals 110 are provided to receive input trigger pulses. Positive trigger pulses applied to the trigger terminals 110, are applied through a transformer 112 through isolating diodes 114, to the base electrodes 16 and 36 of the lower pair of transistors 10 and 30, respectively. Trigger pulses may be applied to all four transistors simultaneously.

For purposes of description, the right output terminals 46 are designated as the "one" output of the flip-flop and the left output terminals 24 are designated as the "zero" output. Assume that the circuit of Figure 3 is in that stable state in which the upper left transistor 50 and the lower right transistor 30 are conducting. With this state of conduction assumed, the flip-flop (Fig. 3) is said to be set, that is, the "one" output 46 is high. The application of a positive going trigger pulse at the input terminals 110 has no effect upon the lower left transistor 10, since its emitter-base diode 14—16 is already reverse biased. An effect is produced on the lower right transistor 30. The positive trigger pulse tends to reverse bias the emitter-base diode 34—36 of the lower right transistor 30 and this transistor leaves the state of saturation. The following events are similar to those that resulted in the monostable circuit of Figure 2. Upon leaving the state of saturation the lower right transistor 30 offers a finite impedance between its collector and emitter electrodes 32—34 and a negative voltage increment is produced at the right junction point 44. This negative voltage increment passes the right junction point 44 to the base electrode 56 of the upper left transistor 50. The upper left transistor 50 thereby tends to a state of non-conduction. The same negative increment from the right junction point 44 tends to increase emitter-collector current in the lower left transistor 10. The collector current of the lower left transistor 10 dissipates the excess charge carriers in the previously saturated upper left transistor 50 to aid in cutting off this transistor 50. This effect is similar to that previously described. Collector current flow in the lower left transistor 10, once the storage effect in the upper left transistor 50 is overcome, results in an incremental positive voltage at the left junction point 22. This incremental positive voltage is transferred to the right transistors base electrodes 36 and 76 through the right cross coupling networks 38—94 and 78—79, respectively. The positive increment at the lower right base electrode 36 takes over the effect of the positive trigger pulse. Similarly, conduction in the upper right transistor 70 is aided. The action again becomes cumulative and the state of the flip-flop is reversed. The upper right transistor 70 and the lower left transistor 10 are now conducting and the flip-flop is reset (the "zero" output 24 is high).

Application of a successive trigger pulse to the input terminal 110 operates to cause the lower right transistor 30 to tend to a state of non-conduction. The ensuing regenerative action takes place as described above and the state of the flip-flop is again reversed.

The flip-flop of Figure 3 possesses advantages of equal rise and fall times in the output waveforms from terminals 24 or 46, small power dissipation within the flip-flop, and high operating rate, etc. Large currents may be supplied from either of the output terminals 24 and 46 to a load in either of the stable states. Thus, in the stable state wherein the diagonally positioned upper left and lower right transistors 50 and 30, respectively, are conducting and in saturation, a load connected to the left output terminals 24 is supplied from the −6 volt source 60 through the upper left transistor 50, which transistor in its saturated condition has a small emitter-collector impedance.

Essentially all of the input power is readily available at the load from either of the output terminals 24 or 46. There is little loss in the flip-flop circuit itself since the collector circuit of any of the flip-flop transistors consists of either the collector electrode of another transistor which is in a state of non-conduction and has an extremely large impedance, or is coupled through a relatively high impedance cross coupling network to the base electrode of the other diagonally positioned conducting transistor of the circuit.

By reversing the type of conductivity of each of the transistors from the N–P–N to P–N–P and P–N–P to N–P–N, as the case may be, and the polarity of the current source applied between the terminal 60 and the point of reference potential 26, a flip-flop having similar characteristics as that described above is obtained. Such a flip-flop is employed in the embodiment of this invention illustrated in Figure 4.

Figure 4:
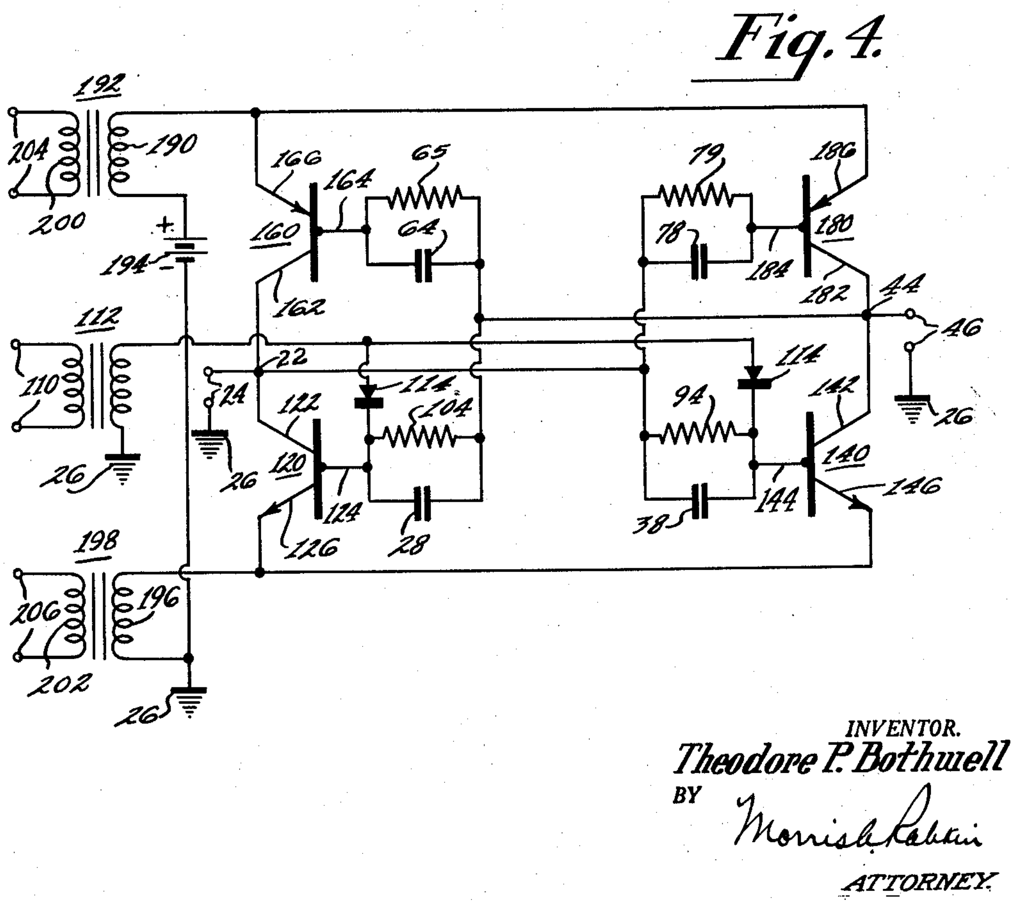

Thus, in Figure 4, a lower pair of transistors 120 and 140 are illustrated as being of the N–P–N type conductivity. The lower left transistor 120 of this pair has a collector electrode 122, a base electrode 124, and an emitter electrode 126. The lower right transistor 140 has a collector electrode 142, a base electrode 144, and an emitter electrode 146. Similarly, an upper pair of flip-flop transistors 160 and 180 of the P–N–P type conductivity are provided. The upper left transistor 160 has a collector electrode 162, a base electrode 164, and an emitter electrode 166. Similarly, the upper right P–N–P transistor has a collector electrode 182, a base electrode 184, and an emitter electrode 186.

As in the case of Figure 3, in Figure 4 the collector electrode 142 of the lower right transistor 140 and the upper right transistor collector electrode 182 are coupled together, and through the parallel connected cross coupling resistor 104 and cross coupling capacitor 28 to the lower left transistor base electrode 124, and through the parallel connected cross coupling resistor 65 and capacitor 64 to the upper left transistor base electrode 164. Also, the lower left transistor collector electrode 122 and the upper left transistor collector electrode 162 are coupled together, and through the parallel connected cross coupling resistor 94 and cross coupling capacitor 38 to the base electrode 144 of the lower right transistor 140, and through the parallel connected cross coupling capacitor 78 and cross coupling resistor 79 to the base electrode 184 of the upper right transistor 180.

Outputs may be taken from the junction point 44 between the right transistor collector electrodes 142 and 182 by the pair of output terminals 46.

The emitter electrodes 166 and 186 of the upper pair of transistors 160 and 180 are coupled together, and through the secondary winding 190 of a transformer 192 to the positive terminal of a source of potential 194, which may, for example, be a battery. The negative terminal of the source of potential 194 is similarly connected to the point of reference potential 26, and through the secondary winding 196 of a transformer 198 to the emitter electrodes 126 and 146 of the lower pair of N–P–N transistors 120 and 140, respectively. Each of the transformers 192 and 198 has a primary winding 200 and 202, respectively. The upper primary winding 200 is provided with a pair of input terminals 204 and the lower primary winding 202 is provided with a pair of input terminals 206. Pulses to be gated may be applied to these input terminals 204 or 206 to be selectively gated to either of the "zero" or "one" outputs of Figure 4, depending upon the condition of the flip-flop. The stabilizing resistors 20, 19 are omitted, but may be included if desired.

The operation of the flip-flop of Figure 4 is in many respects similar to that of Figure 3. In Figure 4, however, trigger pulses at the input terminals 110 function to turn "on" and "off" transistor rather than to turn "off" the conducting (that is, the "on") transistor as was the trigger technique employed in the circuit of Figure 3. The trigger technique of the circuit of Figure 3 may be employed by simply reversing the polarity of the diodes 114 and the polarity of the trigger pulses. Assume that no pulses to be gated are applied at either the upper or lower terminals 204 and 206, respectively, and that the flip-flop is set (that is, the "zero" output at terminals 24 is "low" and the diagonally positioned transistors in the drawing, the lower left transistor 120 and upper right transistor 180, are conducting). The conducting transistors are desirably in region 3 operation as defined in the Ebers and Moll article, which is a state of collector current saturation and relatively low impedance. The remaining transistors, namely the lower right transistor 140 and the upper left transistor 160, are non-conducting.

Note, that for the respective conditions of set and reset for the circuit of Figure 4, the transistors of Figure 4 are in oposite states of conduction to those of Figure 3, because opposite conductivity transistors are employed. With the flip-flop of Figure 4 set, one path of steady state conventional current flow is from the positive terminal of a source 194 through the secondary winding 190, the upper right transistor 180, junction point 44, the lower left cross coupling resistor 104, the emitter-base diode 124—126 of the lower left transistor 120, and the secondary winding 196 to the negative terminal of the source 194. Similarly, steady state conventional current also flows from the positive terminal of the source 194 through the secondary winding 190, the emitter-base diode 186—184 of the upper right transistor 180, the upper right cross couping resistor 79, the lower left transistor collector and emitter electrodes 122—126, secondary winding 196 to the negative terminal of the source 194.

With the flip-flop of Figure 4 in the set condition with the "one" output at terminals 46 having relatively high voltage, and the "zero" output at terminals 24, having a relatively low voltage, successive pulses of either polarity applied to the input terminals 204 of the upper transformer 192 are transmitted through the upper right transistor 180 to the "one" output terminals 46. Since the upper right transistor 180 is desirably in a state of saturation, there is little voltage drop across this transistor. The remainder of the flip-flop circuit remains isolated and independent of this gating function. Similarly, application of positive or negative pulses to be gated at the input terminals 206 of the lower transformer 198 are transmitted through the lower left conducting transistor 120 to the "zero" output terminals 24. As many successive pulses as desired may be applied through either the upper or lower input terminals 204 or 206, respectively, to be respectively gated to the "one" or "zero" output terminals, respectively. In each case, the condition of the flip-flop, which functions as a gate, is not disturbed. Because the state of the flip-flop remains the same, the flip-flop may be said to provide a gate having storage.

A positive trigger pulse applied to the trigger input terminals 110 changes the state of the flip-flop gate of Figure 4 to the "zero" state. The trigger pulse passes through the right isolating diode 114 to the lower right transistor base electrode 144. The emitter-base diode 146—144 of the lower right transistor 140 becomes forward biased and conduction begins. Conduction in the lower right transistor 140 provides a path for current flow to the negative terminal of the source 194 for the collector current of the upper right transistor 180 that is parallel to that of the lower left cross coupling resistor 104. This parallel path results in a reduced collector load and a corresponding negative voltage increment at the right junction point 44 which passes through the lower left cross coupling capacitor 28 to the lower left transistor base electrode 124. The lower left transistor 120 is thereby thrown out of saturation and the resulting voltage drop across this transistor is transmitted as a positive voltage increment through the left junction point 22 and the right cross coupling networks 78—79 and 38—94 to aid in the conduction of the lower right transistor 140 and cut off the upper right transistor 180. This action continues cumulatively in a manner similar to that described above, until the flip-flop is changed to the "zero" state. The lower right transistor 140 and the upper left transistor 160 (diagonally positioned in the drawing) are conducting and the lower left transistor 120 and upper right transistor 180 are cut off. The "one" output is now said to be low in voltage relative to the "zero" output which is high, and the flip-flop is said to be in a "zero" condition.

The application now of successive positive or negative pulses to the input terminals 204 of the upper transformer 192 are passed through the upper left transistor 160 to the "zero" output terminals 24. Conversely, application of successive pulses to be gated at the input terminals 206 of the lower transformer 198 are transmitted through the lower right conducting transistor 140 to the "one" output terminals 46.

Successive pulses to be gated applied to either the upper transformer 192 or the lower transformer 198 may be selectively gated to either the "one" or the "zero" output terminals of the flip-flop, depending upon the condition of the flip-flop. Little impedance is offered by this flip-flop gate since the pulses are transmitted through the relatively small collector-emitter impedance of a transistor at or near the state of saturation. The passage of pulses being gated has little effect upon the condition of the flip-flop gate. In other words, the four-transistor flip-flop may be said to function as a memory element with a non-destructive read out.

The principles of the embodiment illustrated in Figure 4 are also applicable to the embodiments of Figure 1, Figure 2, or Figure 3, by the use of suitable means for applying pulses in series with the supply source as in Figure 4. Thus, in the embodiment of Figure 3, the secondary winding of a transformer (not shown) may be placed in series with the input terminal 60 and the source of potential. Further, transformer coupling need not be employed. Any coupling having a relatively small output impedance is suitable for this application.

Although applicant is not bound by any theory of operation set forth, the device operates substantially in the manner described.

There has thus been described a novel transistor multivibrator circuit which may be employed to function either as an astable, a monostable, or a bistable element. The multivibrator provides output waveforms having equal rise and fall times that may occur at a relatively high rate of speed. The multivibrator itself dissipates very little power and remains stable even with small supply voltages. Relatively large output currents are available from this multivibrator which also may be employed as a self-storing gate.

What is claimed is:

1. A multivibrator circuit comprising a first pair of semiconductor devices of one conductivity type, a second pair of semiconductor devices of another conductivity type, each of said semiconductor devices including a base electrode and a collector electrode, the collector electrodes of one of the semiconductor devices of each of said pairs being coupled together and to the base electrodes of the other semiconductor device of each of said pairs, and the collector electrodes of said other semiconductor devices of each of said pairs being coupled together and to the base electrodes of said one semiconductor device of each of said pairs.

2. A multivibrator gate circuit for providing selective output signals in response to signals to be gated comprising, in combination, a first pair of semiconductor devices of one conductivity type, a second pair of semiconductor devices of another conductivity type, each of said semiconductor devices including a base electrode, an emitter electrode, and a collector electrode, the collector electrodes of one of the semiconductor devices of each of said pairs being coupled together and to the base electrodes of the other semiconductor device of each of said pairs, the collector electrodes of said other semiconductor device of each of said pairs being coupled together and to the base electrode of said one semiconductor device of each of said pairs, and means for receiving said signals to be gated, the emitter electrodes of said first pair of semiconductor devices being coupled together and serially with said gate signal receiving means.

3. A multivibrator circuit comprising a first pair of transistors of one conductivity type, a second pair of transistors of another conductivity type, each of said transistors including a base electrode and a collector electrode, means coupling said collector electrode of one of said first pair of transistors to said collector electrode of one of said second pair of transistors, means coupling said collector electrode of the other one of said first pair of transistors to said collector electrode of the other one of said second pair of transistors, each of said coupling means having substantially zero impedance, first capacitance means coupling said one transistor collector electrodes of each said first and said second transistor pair to said other transistor base electrodes of each of said first and said second transistor pairs, and second capacitance means coupling said other transistor collector electrodes of each said first and said second transistor pairs to said one transistor base electrode of each of said first and said second transistor pairs.

4. A bistable gating circuit having a first output and a second output for selectively passing first and second signals to be gated to said outputs depending on the bistable condition of said circuit comprising, in combination, a first pair of transistors of one conductivity type, a second pair of transistors of another conductivity type, each of said transistors including a base electrode, a collector electrode, and an emitter electrode, means coupling said collector electrode of one of said first pair of transistors to said collector electrode of one of said second pair of transistors, means coupling said collector electrode of the other one of said first pair of transistors to said collector electrode of the other one of said second pair of transistors, each of said coupling means having substantially zero impedance, first means coupling said one collector electrodes of each said first and said second transistor pair to said other base electrodes of said first and said second transistor pairs, and second means coupling said other collector electrodes of each said first and said second transistor pairs to said one base electrode of said first and said second transistor pairs, means for receiving said first signals to be gated serially coupled to said emitter electrodes of said first pair of transistors and means for receiving said second signals to be gated serially coupled to said emitter electrodes of said second pair of transistors.

5. A semiconductor multivibrator circuit comprising in combination a first and a second semiconductor of one conductivity type, and a third and a fourth semiconductor of another conductivity type, each of said semiconductors having a base electrode and a collector electrode, a first means for coupling said first and said third semiconductor collector electrodes together and to said second and said fourth semiconductor base electrodes, and a second means for coupling said second and said fourth semiconductor collector electrodes together and to said first and said third semiconductor base electrodes.

6. A transistor multivibrator circuit comprising in combination, a first and a second transistor of one conductivity type, and a third and a fourth transistor of another conductivity type, each of said transistors having a base electrode, a collector electrode, and an emitter electrode, first means having substantially zero impedance for providing a coupling between said first transistor collector electrode and said third transistor collector electrode, second means having substantially zero impedance for providing a coupling between said second transistor collector electrode and said fourth transistor collector electrode, a first cross coupling network means for coupling said first transistor base electrode to said second coupling means, a second cross coupling network means for coupling said second transistor base electrode to said first coupling means, a third cross coupling network means for coupling said third transistor base electrode to said second coupling means, and a fourth cross coupling network means coupling said fourth transistor base electrode to said first coupling means, each of said first, second, third and fourth cross coupling network means including a capacitor.

7. A transistor astable multivibrator circuit comprising in combination, a first and a second transistor of one conductivity type, and a third and a fourth transistor of another conductivity type, each of said transistors having a base electrode, a collector electrode, and an emitter electrode, first means having substantially zero impedance for providing a coupling between said first transistor collector electrode and said third transistor collector electrode, second means having substantially zero impedance for providing a coupling between said second transistor collector electrode and said fourth transistor collector electrode, a first cross coupling network means for coupling said first transistor base electrode to said second coupling means, a second cross coupling network means for coupling said second transistor base electrode to said first coupling means, a third cross coupling network means for coupling said third transistor base electrode to said second coupling means, and a fourth cross coupling network means for coupling said fourth transistor base electrode to said first coupling means, each of said first and said second cross coupling means each includes a resistor and a capacitor connected in parallel, said third cross coupling network means blocking direct current flow between said third transistor base electrode and said second coupling means and including a capacitor, and said fourth cross coupling network means blocking direct current flow between said fourth transistor base electrode and said first coupling means and including a capacitor.

8. A transistor monostable multivibrator circuit comprising in combination, a first and a second transistor of one conductivity type, and a third and a fourth transistor of another conductivity type, each of said transistors having a base electrode, a collector electrode, and an emitter electrode, first means having substantially zero impedance for providing a coupling between said first transistor collector electrode and said third transistor collector electrode, second means having substantially zero impedance for providing a coupling between said second transistor collector electrode and said fourth transistor collector electrode, a first cross coupling network means for coupling said first transistor base electrode to said second coupling means, a second cross coupling network means for coupling said second transistor base electrode to said first coupling means, a third cross coupling network means for coupling said third transistor base electrode to said second coupling means, and a fourth cross coupling network means for coupling said fourth transistor base electrode to said first coupling means, each of said first, said second, and said third cross coupling means each includes a resistor and a capacitor connected in parallel, said fourth cross coupling network means blocking direct current flow between said fourth transistor base electrode and said first coupling means and including a capacitor.

9. A bistable transistor switching circuit comprising, a source of energizing potentials, a pair of symmetrical current paths, each path consisting of a p-n-p transistor connected in series with a n-p-n transistor by a common collector lead with the emitters of said transistors connected to said potential source with proper polarity for conduction, impedance means cross coupling the base of each transistor in each of said paths to the collector lead in the other of said paths, means for biasing the bases of each of said transistors from said potential source whereby two stable states exist with the p-n-p transistor in one of said paths and the n-p-n transistor in the other of said paths conducting to drive the remaining transistor in each path to cutoff, and means for coupling trigger pulses to the bases of at least two of said transistors to shift from one stable state to the other stable state.

10. A bistable transistor switching circuit consisting of a source of energizing potentials, a pair of symmetrical current paths, each path consisting of a p-n-p transistor connected in series with an n-p-n transistor by a common collector lead with the emitters of said transistors connected to said potential source with proper polarity for conduction, impedance means cross coupling the base of each transistor in each of said paths to the collector lead in the other of said paths, whereby two stable states exist with the p-n-p transistor in one of said paths and the n-p-n transistor in the other of said paths conducting to drive the remaining transistor in each path to cutoff, and means for coupling trigger pulses to the bases of at least two of said transistors to shift from one stable state to the other stable state.

11. A bistable transistor switching circuit comprising, a source of energizing potentials, a pair of symmetrical current paths, each path consisting of a p-n-p transistor connected in series with a n-p-n transistor by a common collector lead with the emitters of said transistors connected to said potential source with proper polarity for conduction, resistance means cross coupling the base of each transistor in each of said paths to the collector lead in the other of said paths, means for biasing the bases of each of said transistors from said potential source whereby two stable states exist with the p-n-p transistor in one of said paths and the n-p-n transistor in the other of said paths conducting to drive the remaining transistor in each path to cutoff, and means for coupling trigger pulses to the bases of said transistors to shift from one stable state to the other stable state.

12. A bistable transistor switching circuit comprising, a source of energizing potentials of positive and negative polarities, first and second symmetrical parallel current paths, each path consisting of a p-n-p transistor serially connected to a n-p-n transistor by a common collector lead with the emitters of said transistors being connected to said potential source with proper polarity for conduction, resistance means for cross coupling the base of each transistor in said first path to said collector lead in said second path and the base of each transistor in said second path to said collector lead in said first path, means for biasing the bases of each transistor by potentials from said source whereby a first stable state exists with the n-p-n transistor in said first path and the p-n-p transistor in said second path conducting to bias the remaining transistors to cutoff and a second stable state exists with the p-n-p transistor in said first path and the n-p-n transistor in said second path conducting to bias the remaining transistors to cutoff.

13. A bistable transistor switching circuit comprising, a source of energizing potentials of positive and negative polarities, first and second symmetrical parallel current paths, each path consisting of a p-n-p transistor serially connected to a n-p-n transistor by a common collector lead with the emitters of said transistors being connected to said potential source with proper polarity for conduction, and capacitor coupling means connected between the bases of said transistors in each current path, resistance means for cross coupling the base of each transistor in said first path to said collector lead in said second path and the base of each transistor in said second path to said collector lead in said first path, means for biasing the bases of each transistor by potentials from said source whereby a first stable state exists with the n-p-n transistor in said first path and the p-n-p transistor in said second path conducting to bias the remaining transistors to cutoff and a second stable state exists with the p-n-p transistor in said first path and the n-p-n transistor in said second path conducting to bias the remaining transistors to cutoff.

14. A bistable transistor switching circuit comprising, a source of energizing potentials of positive and negative polarities, first and second symmetrical parallel current paths, each path consisting of a p-n-p transistor serially connected to a n-p-n transistor by a common collector lead with the emitters of said transistors being connected to said potential source with proper polarity for conduction, and capacitor coupling means connected between the bases of said transistors in each current path, resistance means for cross coupling the base of each transistor in said first path to said collector lead in said second path and the base of each transistor in said second path to said collector lead in said first path, means for biasing the bases of each transistor by potentials from said source whereby a first stable state exists with the n-p-n transistor in said first path and the p-n-p transistor in said second path conducting to bias the remaining transistors to cutoff and a second stable state exists with the p-n-p transistor in said first path and the n-p-n transistor in said second path conducting to bias the remaining transistors to cutoff, and means for applying trigger pulses to the bases of said transistors and to initiate conduction in said nonconducting transistors and to terminate conduction in said conducting transistors to shift from said first stable state to said second stable state.

15. A bistable transistor switching circuit comprising a source of energizing potentials, a pair of p-n-p transistors and a pair of n-p-n transistors, each of said transistors having emitter, collector and base electrodes, a first current path formed by a first p-n-p transistor connected to a first n-p-n transistor by a common collector lead, the emitter electrode of said p-n-p transistor being connected to a positive potential at said source and the emitter electrode of said n-p-n transistor being connected to a negative potential at said source, a second current path formed by the second of said pair of p-n-p transistors connected to the second of said pair of n-p-n transistors by a common collector lead, the emitter electrode of said second p-n-p transistor being connected to said positive potential and the emitter electrode of said second n-p-n transistor being connected to said negative potential thereby forming a pair of symmetrical current paths, resistance means coupling the base electrode of each p-n-p transistor to the collector electrode of the other p-n-p transistor of said pair of p-n-p transistors and the base electrode of each n-p-n transistor to the collector electrode of the other n-p-n transistor of said pair of n-p-n transistors, means for biasing the base electrodes of said transistors from said source whereby conduction of said first p-n-p transistor and said second n-p-n transistor at a relatively low impedance biases said first n-p-n transistor and said second p-n-p transistor to a relatively high impedance in a first stable state and conduction of said first n-p-n transistor and said second p-n-p transistor at a relatively low impedance biases said first p-n-p transistor and said second n-p-n transistor to a relatively high impedance in a second stable state.

16. A bistable transistor switching circuit comprising a source of energizing potentials, a pair of p-n-p transistors and a pair of n-p-n transistors, each of said transistors having emitter, collector and base electrodes, a first current path formed by a first p-n-p transistor connected to a first n-p-n transistor by a common collector lead, the emitter electrode of said p-n-p transistor being connected to a positive potential at said source and the emitter electrode of said n-p-n transistor being connected to a negative potential at said source, a second current path formed by the second of said pair of p-n-p transistors connected to the second of said pair of n-p-n transistors by a common collector lead, the emitter electrode of said second p-n-p transistor being connected to said positive potential and the emitter electrode of said second n-p-n transistor being connected to said negative potential thereby forming a pair of symmetrical current paths, resistance means coupling the base electrode of each p-n-p transistor to the collector electrode of the other p-n-p transistor of said pair of p-n-p transistors and the base electrode of each n-p-n transistor to the collector electrode of the other n-p-n transistor of said pair of n-p-n transistors, means for biasing the base electrodes of said transistors from said source whereby conduction of said first p-n-p transistor and said second n-p-n transistor at a relatively low impedance biases said first n-p-n transistor and said second p-n-p transistor to a relatively high impedance in a first stable state and conduction of said first n-p-n transistor and said second p-n-p transistor at a relatively low impedance biases said first p-n-p transistor and said second n-p-n transistor to a relatively high impedance in a second stable state, and means for applying trigger pulses to the base electrodes of said transistors to shift said circuit from one stable state to the other.

17. A bistable transistor switching circuit comprising a source of energizing potentials, a pair of p-n-p transistors and a pair of n-p-n transistors, each of said transistors having emitter, collector and base electrodes, a first current path formed by a first p-n-p transistor connected to a first n-p-n transistor by a common collector lead, the emitter electrode of said p-n-p transistor being connected to a positive potential at said source and the emitter electrode of said n-p-n transistor being connected to a negative potential at said source, a second current path formed by the second of said pair of p-n-p transistors connected to the second of said pair of n-p-n transistors by a common collector lead, the emitter electrode of said second p-n-p transistor being connected to said positive potential and the emitter electrode of said second n-p-n transistor being connected to said negative potential thereby forming a pair of symmetrical current paths, a capacitor connected from base electrode to base electrode between transistors in each of said paths, resistance means coupling the base electrode of each p-n-p transistor to the collector electrode of the other p-n-p transistor of said pair of p-n-p transistors and the base electrodes of each n-p-n transistor to the collector electrode of the other n-p-n transistor of said pair of n-p-n transistors, means for biasing the base electrodes of said transistors from said source whereby conduction of said first p-n-p transistor and said second n-p-n transistor at a relatively low impedance biases said first n-p-n transistor and said second p-n-p transistor to a relatively high impedance in a first stable state and conduction of said first n-p-n transistor and said second p-n-p transistor at a relatively low impedance biases said first p-n-p transistor and said second n-p-n transistor to a relatively high impedance in a second stable state, and means for applying trigger pulses to the base electrodes of said transistors to shift said circuit from one stable state to the other.

18. A transistor multivibrator circuit comprising, in combination, a first and a second transistor of one conductivity type, and a third and a fourth transistor of another conductivity type, each of said transistors having a base electrode, a collector electrode, and an emitter electrode, first means having substantially zero impedance for providing a coupling between said first transistor collector electrode and said third transistor collector electrode, second means having substantially zero impedance for providing a coupling between said second transistor collector electrode and said fourth transistor collector electrode, a first cross coupling network means for coupling said first transistor base electrode to said second coupling means, a second cross coupling network means for coupling said second transistor base electrode to said first coupling means, a third cross coupling network means for coupling said third transistor base electrode to said second coupling means, and a fourth cross coupling network means coupling said fourth transistor base electrode to said first coupling means, each of said first, second, third, and fourth cross coupling network means including a resistor.

19. A transistor switching circuit comprising means for connecting to a source of energizing potentials, a pair of current paths connected to said connecting means, each of said paths consisting of a p-n-p transistor serially connected to an n-p-n transistor by a common collector lead with the emitters of said transistors polarized for conduction, impedance means cross coupling the base of each transistor in each of said paths to the collector lead in the other of said paths, and means for biasing the base of each transistor from said source to cause the circuit to have two mutually exclusive states in one of which the n-p-n transistor in one of said pair of paths and the p-n-p transistor in the other of said pair of paths conduct to bias the remaining transistors to cutoff and in the other of said states said remaining transistors conduct to bias the said n-p-n transistor in said one path and the said p-n-p transistor in said other path to cutoff.

20. A transistor switching circuit comprising means for connecting to a source of energizing potentials, a pair of symmetrical current paths connected to said connecting means, each of said paths consisting of a p-n-p transistor serially connected to an n-p-n transistor by a common collector lead with the emitters of said transistors polarized for conduction, resistor means cross coupling the base of each transistor in each of said paths to the collector lead in the other of said paths, and means for biasing the base of each transistor from said source to cause the circuit to have two mutually exclusive states in one of which the n-p-n transistor in one of said pair of paths and the p-n-p transistor in the other of said pair of paths conduct to bias the remaining transistors to cutoff and in the other of said states said remaining transistors conduct to bias the said n-p-n transistor in said one path and the said p-n-p transistor in said other path to cutoff.

21. A transistor switching circuit comprising means for connecting to a source of energizing potentials, a pair of current paths connected to said connecting means, each of said paths consisting of a p-n-p transistor serially connected to an n-p-n transistor by a common collector lead with the emitters of said transistors polarized for conduction, impedance means cross coupling the base of each transistor in each of said paths to the collector lead in the other of said paths to provide conductive connections from each of said paths to the other to cause the circuit to have two mutually exclusive states in one of which the n-p-n transistor in one of said pair of paths and the p-n-p transistor in the other of said pair of paths conduct at least partially through one of said connections to bias the remaining transistors to cutoff and in the other of said states said remaining transistors conduct at least partially through the other of said connections to bias the said n-p-n transistor in said one path and the said p-n-p transistor in said other path to cutoff.

22. A transistor switching circuit comprising means for connecting to a source of energizing potentials of positive and negative polarities, first and second symmetrical parallel current paths, each path consisting of a p-n-p conductivity type transistor serially connected to an n-p-n conductivity type transistor by a common collector lead with the emitters of said transistors being connected to said source connecting means with proper polarity for conduction, capacitor means for cross coupling the base of each transistor in said first path to said collector lead in said second path and the base of each transistor in said second path to said collector lead in said first path, means for biasing the bases of each transistor by potentials from said source whereby a first stable state exists with one of said transistors in one path conductive and the transistor of like conductivity type in the other path non-conductive and a second stable state exists with said one transistor non-conductive and said transistor of like conductivity type conductive.

23. A multivibrator circuit comprising a first pair of semiconductor devices of one conductivity type, a second pair of semiconductor devices of another conductivity type, each of said semiconductor devices including a base electrode and a collector electrode, the collector electrodes of one of the semiconductor devices of each of said pairs being coupled together and to the base electrodes of the other semiconductor devices of said pairs, and the collector electrodes of said other semiconductor devices being coupled together and to the base electrodes of said one semiconductor devices.

24. A multivibrator circuit comprising a first pair of transistors of one conductivity type, a second pair of transistors of another conductivity type, each of said transistors including a base electrode and a collector electrode, first means coupling said collector electrode of one of said first pair of transistors to said collector electrode of one of said second pair of transistors, second means coupling said collector electrode of the other of said first pair of transistors to said collector electrode of the other of said second pair of transistors, each of said first and second coupling means having substantially zero impedance, and a first and a second pair of cross coupling networks, said first pair of cross coupling networks being coupled between said first coupling means and, respectively, said base electrodes of said other transistors, said second pair of cross coupling networks being coupled between said second coupling means and, respectively, said base electrodes of said other transistors, one network of each of said network pairs including a resistor.

25. A semiconductor multivibrator circuit comprising, in combination, a first and a second semiconductor of one conductivity type, and a third and a fourth semiconductor of another conductivity type, each of said semiconductors having a base electrode, an emitter electrode, and a collector electrode, a first means for coupling said first and said third semiconductor collector electrodes together and to said second and said fourth semiconductor base electrodes, and a second means for coupling said second and said fourth semiconductor collector electrodes together and to said first and said third semiconductor base electrodes.

References Cited in the file of this patent

UNITED STATES PATENTS 2,605,306 Eberhard ---------------- July 29, 1952

OTHER REFERENCES

Article entitled, Complementary Symmetry-Electronics, September 1953, p. 140.